United States Patent
Kallam et al.

(10) Patent No.: US 9,172,361 B2
(45) Date of Patent: Oct. 27, 2015

(54) MULTI-STAGE DELAY-LOCKED LOOP PHASE DETECTOR

(71) Applicant: Silicon Laboratories Inc., Austin, TX (US)

(72) Inventors: Praveen Kallam, Austin, TX (US); Dennis Sinitsky, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/840,675

(22) Filed: Mar. 15, 2013

(65) Prior Publication Data

US 2014/0266370 A1    Sep. 18, 2014

(51) Int. Cl.
*H03D 13/00* (2006.01)
*H03K 5/15* (2006.01)

(52) U.S. Cl.
CPC ................................ *H03K 5/1504* (2013.01)

(58) Field of Classification Search
CPC ........ H03K 5/1504; H03L 7/091; H03L 7/08; H03L 7/10; H03L 2207/06; H03L 7/00; H03L 7/06
USPC ........................................... 327/1, 2, 3, 7, 12
See application file for complete search history.

(56) References Cited

U.S. PATENT DOCUMENTS

| | | | |
|---|---|---|---|
| 5,532,632 A | 7/1996 | Kent | |
| 5,592,110 A * | 1/1997 | Noguchi | 327/12 |
| 6,351,154 B2 | 2/2002 | Brachmann et al. | |
| 7,202,707 B2 | 4/2007 | Momtaz | |
| 7,830,190 B2 * | 11/2010 | Hsu | 327/208 |
| 2004/0153681 A1 | 8/2004 | Cao | |
| 2008/0278211 A1 | 11/2008 | Heightley | |

OTHER PUBLICATIONS

Foley, David J.; and Flynn, Michael P., "CMOS DLL-Based 2-V 3.2-ps. Jitter 1-GHz Clock Synthesizer and Temperature-Compensated Tunable Oscillator," IEEE Journal of Solid-State Circuits, vol. 36, No. 3, Mar. 2001, pp. 417-423.

Ghaffari, A; and Abrishamifar, A.; "A New Lock-Detect Circuit for Self Correcting DLLs, 3rd International Conference on Electrical and Electronics Engineering," Sep. 6-8, 2006, pp. 1-4.

* cited by examiner

*Primary Examiner* — Hai L Nguyen
(74) *Attorney, Agent, or Firm* — Cesari & Reed LLP; R. Michael Reed

(57) ABSTRACT

A phase detector includes a phase propagator circuit including a plurality of flip-flops. Each flip-flop includes a clock input configured to receive a clock signal having a different phase relative to phases of the clock signal received by other flip-flops in the plurality of flip-flops. The phase detector further includes a phase controller coupled to the clock input of each flip-flop in the plurality of flip-flops. The phase controller is configured to provide the different phases of the clock signal to the plurality of flip-flops such that the different phases are scaled exponentially relative to one another.

19 Claims, 4 Drawing Sheets

MULTI-STAGE DELAY-LOCKED LOOP PHASE DETECTOR

FIELD

The present disclosure is generally related to multi-stage delay-locked loop phase detectors.

BACKGROUND

Delay lock-loops (DLLs) have been widely used to generate on-chip clocks in microprocessors, memory interfaces, and communication circuits. DLLs include a delay block having an input to receive a reference signal and an output to provide a delayed version of the reference signal. The delay block often includes a series of delay elements, which may be individually controlled to adjust the cumulative delay through the delay block. DLLs further include a phase detector coupled to the input and the output of the delay block to detect a phase error between the reference signal and the delayed version of the reference signal and to adjust the delays in a series of delay elements so that cumulative delay through the series of delay elements is equal to a known reference delay.

SUMMARY

In an embodiment, a phase detector includes a phase propagator circuit including a plurality of flip-flops. Each flip-flop includes a clock input configured to receive a clock signal having a different phase relative to phases of the clock signal received by other flip-flops in the plurality of flip-flops. The phase detector further includes a phase controller coupled to the clock input of each flip-flop in the plurality of flip-flops. The phase controller is configured to provide the different phases of the clock signal to the plurality of flip-flops such that the different phases are scaled non-linearly relative to one another.

In another embodiment, a phase detector circuit includes a phase propagator circuit including a series of flip-flops and configured to receive a plurality of phase-shifted clock signals. Each flip-flop includes a clock input configured to receive one of the plurality of phase-shifted clock signals to receive a different phase relative to phases at clock inputs of the other flip-flops. The phase detector further includes a phase controller configured to receive the plurality of phase-shifted clock signals from a delay line and to provide the different phases to the clock inputs such that phase order indices of the different phases are scaled non-linearly relative to one another.

In still another embodiment, a method of phase locking to an input signal includes receiving an input signal at a phase propagator, and receiving a plurality of clock signals at a phase controller. The method further includes selectively providing different phases of the plurality of clock signals to a plurality of flip-flops of the phase propagator such that the different phases are scaled non-linearly relative to one another.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

A phase detector is a circuit which adjusts delay in a series of delay elements so that cumulative delay is equal to a known reference delay. In an example, the phase controller may be coupled to a series of delay elements and configured to measure the delay across the delay elements and to adjust the cumulative delay to attempt to match a known reference delay.

In an example, an initial signal ph1 is an input clock signal that includes a clock period (T), and the edge of phase locked signal phN edge is aligned to an edge of initial signal ph1, so that delay through each of the delay elements and the total delay from initial input signal ph1 to the phase locked signal phN is exactly T. However, some DLLs may achieve a false lock, where the delay from the initial signal ph1 to phase locked signal phN is an integer multiple of the clock period (T) that is greater than one (i.e., 2T, 3T, etc.). Prior art phase detector implementations sometimes use a large number of flip-flops, between N and N/2, to avoid false locking. Unfortunately, for high resolution of phase signals, a large number of delay elements in the DLL (i.e. N=128 or 256) may be used. Conventional phase detectors often include a large number of flip-flops to provide the desired phase lock resolution, and the large number is detrimental for area and power dissipation.

It is possible to achieve relatively high resolution in phase locking without using a corresponding number of flip-flops inside phase detectors. Moreover, the smaller circuit can achieve phase lock without false locking. One possible example of a phase detector circuit is described below with respect to FIG. 1.

Figure 1:
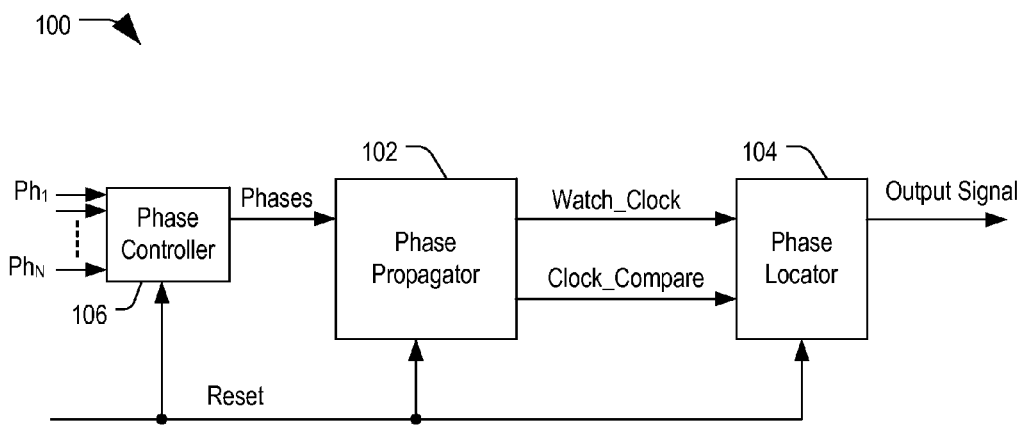
FIG. 1 is a block diagram of a DLL phase detector according to an embodiment.

FIG. 1 is a block diagram of a DLL circuit 100 including a phase propagator 102 and a phase locator 104 according to an embodiment. Phase propagator 102 includes a first input to receive an input signal (labeled "Phases") from a phase controller 106, a reset input to receive a reset signal, a first output to provide watch clock signal (labeled "Watch_Clock"), and a second output to provide a clock comparison signal (labeled "Clock_Compare"). Phase locator 104 includes first and second inputs coupled to the first and second outputs, respectively, of phase propagator 102, a reset input to receive a reset signal, and an output to provide a phase error signal.

Phase controller 106 may be configured to pass multiple phases to phase propagator 102. The phase indices from phase controller 106 may differ from one another exponentially. In an example, the phases may be selected based on a radix of two such that instead of phases 1, 2, 3, etc., phase controller 106 provides phases 1, 2, 4, 8, 16, and so on.

In an embodiment, phase propagator 102 receives an input signal and produces the clock comparison signal (Clk_Compare), as well as the watch clock signal, which is compared to late and early clock edges of clock comparison signal. In an example, DLL circuit 100 is initially reset using the reset signal applied to the reset inputs of phase propagator 102 and phase locator 104, and then DLL circuit 100 is released from reset. Subsequently, phase locator 104 receives the watch clock signal and the clock comparison signal. If the rising edge of the watch clock signal precedes the rising edge of the clock comparison signal, phase locator 104 produces a phase error signal having a logic high value indicating that rising edge of the signal to be monitored is too fast relative to the rising edge of the clock comparison signal. Otherwise, phase locator 104 produces the phase error signal having a logic low level.

Phase locator 104 may be implemented using various logic circuit structures. One possible embodiment of phase locator 104 implemented as a D flip-flop is described below with respect to FIG. 2.

Figure 2:
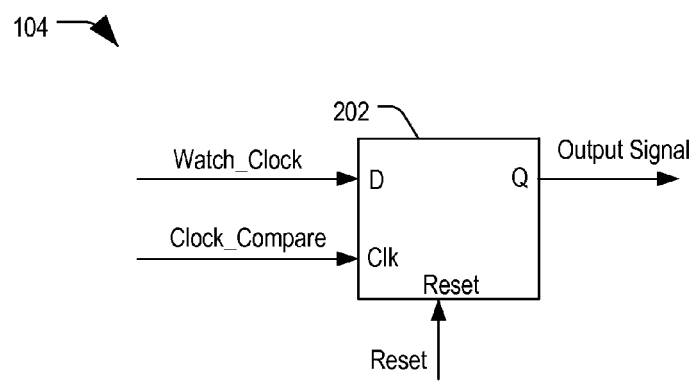
FIG. 2 is a block diagram of a phase locator of the DLL circuit of FIG. 1 according to an embodiment.

FIG. 2 is a block diagram of a phase locator 104 of the DLL circuit of FIG. 1 according to an embodiment. Phase locator 104 includes a D flip-flop 202 having a D-input to receive the watch clock signal, a clock input to receive the clock comparison signal, a reset input to receive the reset signal, and a Q-output to provide an output signal.

The reset signal is applied to the reset input, causing D flip-flop 202 to ignore the value at the D-input and setting the Q-output to a logic low level. After the reset signal is removed, D flip-flop 202 captures the value of the watch clock signal at the D-input at a rising edge of the clock comparison signal. D flip-flop 202 provides the captured value to the Q-output as the output signal.

The timing of the watch clock signal and the clock comparison signal and their relation to the reset signal determine proper operation of phase locator 104. Two possible examples of the timing of the signals are described below with respect to FIG. 3 (showing presence and absence of false lock).

Figure 3:
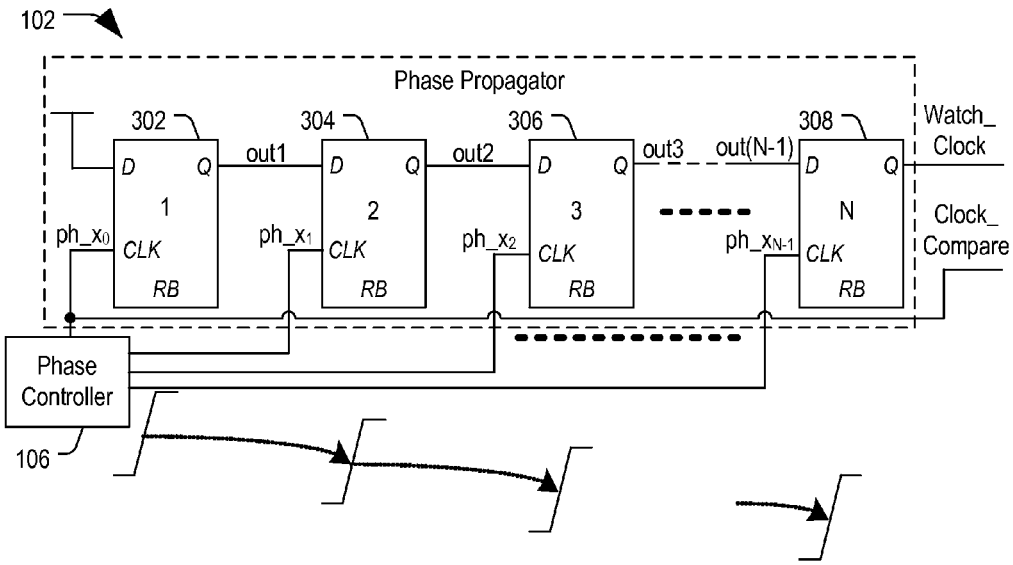
FIG. 3 is a block diagram of a flip-flop chain used in the phase propagator of FIG. 1 according to an embodiment.

FIG. 3 is a block diagram of a flip-flop chain used in the phase propagator 102 of FIG. 1 according to an embodiment. Phase propagator 302 includes a series of flip-flops 302, 304, 306, and 308, each of which has a clock input coupled to a phase controller 106. Phase propagator 102 can include any number of flip-flops, depending on the implementation.

Flip-flop 302 includes a D-input coupled to a power supply terminal, a clock input coupled to phase controller 106 to receive first input signal that is indexed as $ph\_x_0$ (having a first clock phase $ph_1$), a reset input to receive the input signal, and a Q-output to provide a first output (out1) to a D-input of flip-flop 304. Flip-flop 304 further includes a clock input coupled to phase controller 106 to receive a second input signal that is indexed as $ph\_x_1$ having second clock phase ($ph_2$), a reset input to receive a reset signal, and a Q-output to provide a second output (out2) to a D-input of flip-flop 306. Flip-flop 306 includes a clock input coupled to phase controller 106 to receive a third input signal that is indexed as $ph\_x_2$, a reset input to receive a reset signal, and a Q-output to provide a third output (out3) to a D-input of next flip-flop in the series. The last flip-flop 308 includes a D-input coupled to a previous flip-flop in the chain to receive an output signal (out(N−1)), where the chain includes a number (N) flip-flops. Flip-flop 308 further includes a clock input coupled to phase controller 106 to receive an input signal that is indexed as $ph\_x_{N-1}$, a reset input to receive a reset signal, and a Q-output to provide a phase locked output signal (outN). Since the phase phN of FIG. 1 is usually locked to ph1, the phase $ph\_x_{N-1}$ of FIG. 3 can be chosen as phN so that outN edge corresponds to phN edge.

Phase propagator 102 in FIG. 3 causes the phase locked output signal (outN) to toggle at edge $e_0$ of N-th input signal $ph_N$ after the reset is released. However, phase propagator 102 in FIG. 3 includes a number (N) of flip-flops, and the number N can be a large number in multi-stage DLLs.

Figure 4:
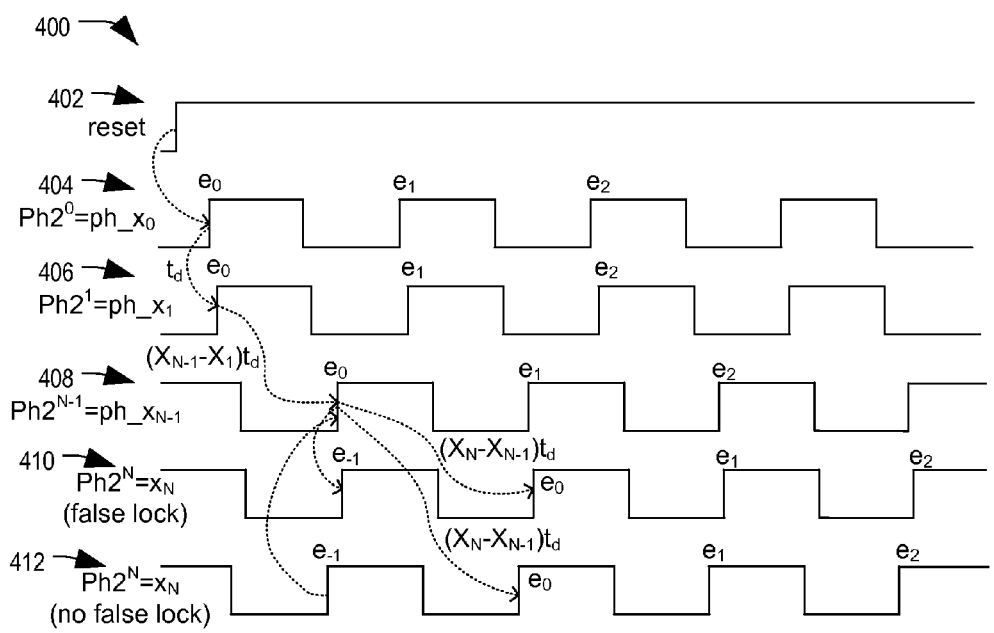
FIG. 4 is a timing diagram illustrating phase relationships between input signals to the phase locator of FIG. 2 according to an embodiment, showing true lock and false lock scenarios.

FIG. 4 is a timing diagram 400 illustrating phase relationships between input signals to the phase propagator 102 of FIG. 1 according to an embodiment. The signals $ph\_x_0$ through $ph\_x_N$ further constitute Watch_Clock and Clock_Compare signals of the phase locator 104. Timing diagram 400 includes a reset signal 402, a first input signal having a first phase ($ph2^0$ indexed as $ph\_x_0$) 404, a second input signal having a second phase ($ph2^1$ indexed as $ph\_x_1$) 406, a third input signal having a third phase ($ph2^{N-1}$ indexed as $ph\_x_{N-1}$) 408, an n-th input signal 410 having an n-th phase ($ph2^N$ indexed as $ph\_x_N$) of phase propagator ($ph\_x_N$) 410. N-th input signal 410 illustrates a false lock where the timing of the delayed edge of the input signal is later than the clocked edge of one of the clock phases. Timing diagram further includes a second n-th input signal 412 having an n-th phase ($ph2^N$ indexed as $ph\_x_N$) that is phase locked to the input signal with no false lock, which is used as a clock to phase lock the output signal to the input signal at the output of the DLL circuit. In an example, the DLL circuit may include multiple delay stages in a series, and the n-th input signal ($ph_N$) 412 may be from the output of the last delay stage in the series.

Input signal 404 includes edges labeled "$e_0$", "$e_1$", "$e_2$", and "$e_3$". The n-th input signal 412 includes edges labeled "$e_{-1}$", "$e_0$", "$e_1$", and "$e_2$". The notation assumes that edge $e_0$ of n-th input signal $ph\_x_N$ 412 represents a delayed version of edge $e_0$ of phase $ph\_x_0$. If edge $e_{-1}$ of $ph\_x_N$ occurs before edge $e_0$ of $ph\_x_{N-1}$, false lock occurs. This is because the phase locator 104 will subsequently compare edge $e_1$ of $ph\_x_0$ to edge $e_{-1}$ (and not edge $e_0$) of $ph\_x_N$. If edge $e_{-1}$ of $ph\_x_N$ (phN of FIG. 1) is compared to edge $e_1$ of $ph\_x_0$ (ph1 of FIG. 1), the DLL feedback action can force the total delay to be equal to 2T (two times the input clock period), which corresponds to a false lock condition. On the other hand, in edge $e_{-1}$ of phase $ph\_x_N$ occurs before edge $e_0$ of $ph\_x_{N-1}$, there is no false lock, because phase locator 104 will compare edge $e_1$ of $ph\_x_0$ to edge $e_0$ of $ph\_x_N$, and the DLL feedback action forces the total delay to be equal to T as intended.

The selected edge of n-th input signal phN 412 can be singled out by a flip-flop chain, such as the flip-flop chain described in FIG. 3. Phase propagator 102 in FIG. 3 includes a number (N) of flip-flops, and the number (N) can be a large number in multi-stage DLLs. It is possible to reduce the number of flip-flops in phase propagator 102 while still retaining linearity. One example of a phase propagator 102 that uses fewer flip-flops by scaling phases exponentially with a radix of two or less is describe below with respect to FIG. 5.

Figure 5:
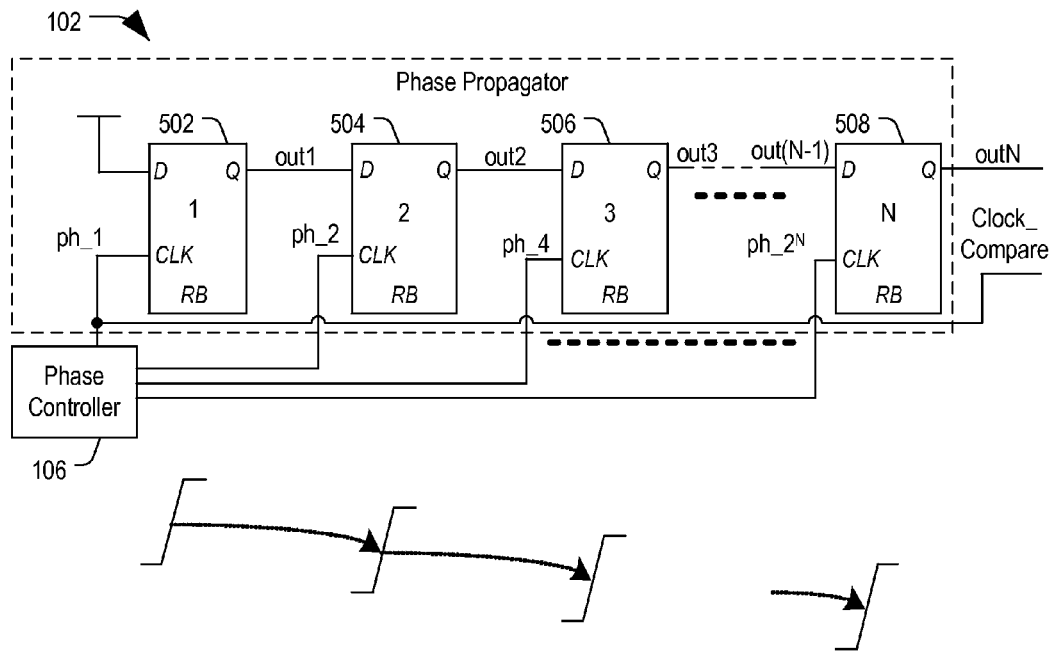
FIG. 5 is a block diagram of a flip-flop chain used in the phase propagator of FIG. 1 with exponential phase scaling according to a second embodiment.

FIG. 5 is a block diagram of a flip-flop chain used in the phase propagator 102 of FIG. 1 with exponential phase scaling according to a second embodiment. In this embodiment, phase propagator 102 includes a series of flip-flops 502, 504, 506 and 508, each of which includes a clock input coupled to phase controller 106, which may be programmed to provide clock phases according to an exponential phase scale ($2^N$). Phase propagator 102 can include any number of flip-flops, depending on the implementation. Flip-flops 302 and 304 are coupled to one another as described above with respect to FIG. 3. However, the next flip-flop 502 in the series begins to show the exponential scaling of the phase relationship. In particular, flip-flop 502 includes a D-input to receive the second output (out2) from the Q-output of flip-flop 304, and includes a clock input coupled to phase controller 106 to receive a clock signal (ph4), which is determined by phase $2^N$. Thus, flip-flop 302 receives a phase equal to $2^0=1$, flip-flop 504 receives a phase equal to $2^1=2$, and flip-flop 502 receives a phase equal to $2^2=4$. Flip-flop 502 further includes a reset input, and a Q-output to provide a third output (out3) to a D-input of next flip-flop in the series. The last flip-flop 504 includes a D-input coupled to a previous flip-flop in the chain to receive an output signal (out(N−1)), where the chain includes a number (N) flip-flops. Flip-flop 504 further includes a clock input coupled to phase controller 106 to receive a clock signal having a last phase (ph2$^{(N-1)}$), a reset input to receive a reset signal, and a Q-output to provide a phase locked output signal (outN).

Phase controller 106 passes on clock phases that scale exponentially, reducing the number of flip-flops in phase propagator used to generate watch clock to determine relationship between corresponding edges of first and last phases of the delay chain. As discussed below, if exponential scaling with radix two is used and if, after reset is released, edge $e_0$ of input signal ph2$^0$ 504 is the first edge, then the rising edge of output signal outN is derived from the edge $e_0$ of n-th input signal ph2$^N$ 512.

The phase controller 106, after being released from reset, produces single-edge for the clock comparison signal, which is fed into a clock input of flip-flop 302. The chain of flip flops 502, 504, 506, and 508 synchronizes rising pulses to particular clock phases. Scaling the chosen clock phases with a radix of less than two (such as a radix of 1.6) prevents a false lock.

In general, the phase scaling does not have to have a fixed radix. Instead, the scaling factor of the phase indices can vary. In a particular embodiment, the scaling factor of the phase indices can vary up to a value of 2. In another embodiment, the scaling factor varies but stays at a value that is less than two for each subsequent phase index entering the phase propagator 102, so the phase scaling may be varied in a non-linear fashion. In a particular embodiment, the phase scaling may be varied essentially-exponentially with radix <2, by varying the radix between the various phase indices.

As can be seen from FIG. 5, if false lock condition occurs, this means that $e_{-1}$ edge of signal ph_$x_N$ follows later than e0 edge of signal ph_$x_{N-1}$. The delay from ph_$x_0$ to ph_$x_{N-1}$ is equal to $(x_{N-1}-x_0)t_d$, where $t_d$ is the delay of a single buffer. The delay from edge e0 of ph_$x_{N-1}$ to $e_0$ of ph_$x_N$ is equal to $(x_N-x_{N-1})$td, and in case of false lock $(x_N-x_{N-1})t_d>T$ (T is clock period, or distance between $e_{-1}$ and $e_0$ of ph_$x_N$).

Select the very first index ph_$x_M$ such that e−1 of ph_$x_M$ precedes ph_$x_{M-1}$. Then we can write:

$$(x_{M-1}-x_0)t_d<T<(x_e-x_{M-1})t_d, \text{ or } x_{M-1}-x_0<x_M-x_{M-1}. \quad (1)$$

Note that for sequence 0, 1, 2, 4, 8, etc., the inequality above turns into an equality, for every M. The sequence 0, 1, n, $n^2$, $n^3$, ... where n<2 provides the relationship defined in Equation 1 with signs reversed. Therefore, if phases are chosen that are scaled exponentially with radix less than or equal to 2, false lock can be avoided.

In practice, due to mismatches between delay elements in a DLL chain and due to other delays in the signal path, a radix slightly smaller than 2 can be chosen to provide redundancy. In an example, a phase index of 1.9 provides correct operation of phase detector. In a multi-stage DLL with N=256, a prior art DLL implementation 256 or 128 flip-flops, which consumed significant circuit area and power in the DLL circuit. In contrast, DLL 100 can provide a phase lock using 9 flip-flops in the chain when a radix of 1.9 is used, according to the following equation:

$$\log_{1a} 256 = 8.64. \quad (2)$$

Therefore, based on Equation 2, the phase detector can provide a phase lock using nine flip-flop stages of phase propagator if radix 1.9 is used.

The exponentially scaled phase propagator 102 with a radix slightly less than 2 can be used in a high-resolution pulse-width modulator (hrpwm), which employs a 128-stage DLL, in order to generate clock phases with granularity T/128, where T is the input clock period. Further, the application phase propagator 102 may be generalized to any multi-stage DLL, whether DLL is used for hrpwm or other clock phase generation purposes.

Figure 6:
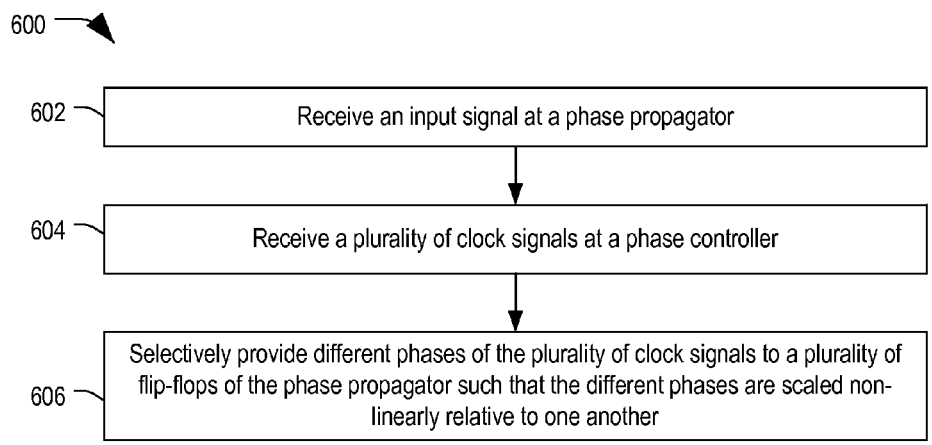
FIG. 6 is a flow diagram of a method of phase locking to an input signal according to a first embodiment.

FIG. 6 is a flow diagram of a method 600 of phase locking to an input signal according to an embodiment. At 602, an input signal is received at a phase propagator. In an example, the input signal may be a reference voltage, a supply voltage, or another signal.

Advancing to 604, a plurality of clock signals are received at a phase controller. The plurality of clock signals may include a plurality of different phases. Continuing to 606, different phases of the plurality of clock signals are selectively provided to a plurality of flip-flops of the phase propagator such that the different phases are scaled non-linearly relative to one another.

In an example, the different phases are scaled substantially exponentially starting with a first phase. The exponential scaling may use a radix of 2 or less. Alternatively, the radix may be selectively adjusted from phase to phase or for at least some of the phases to enhance phase detection.

Figure 7:
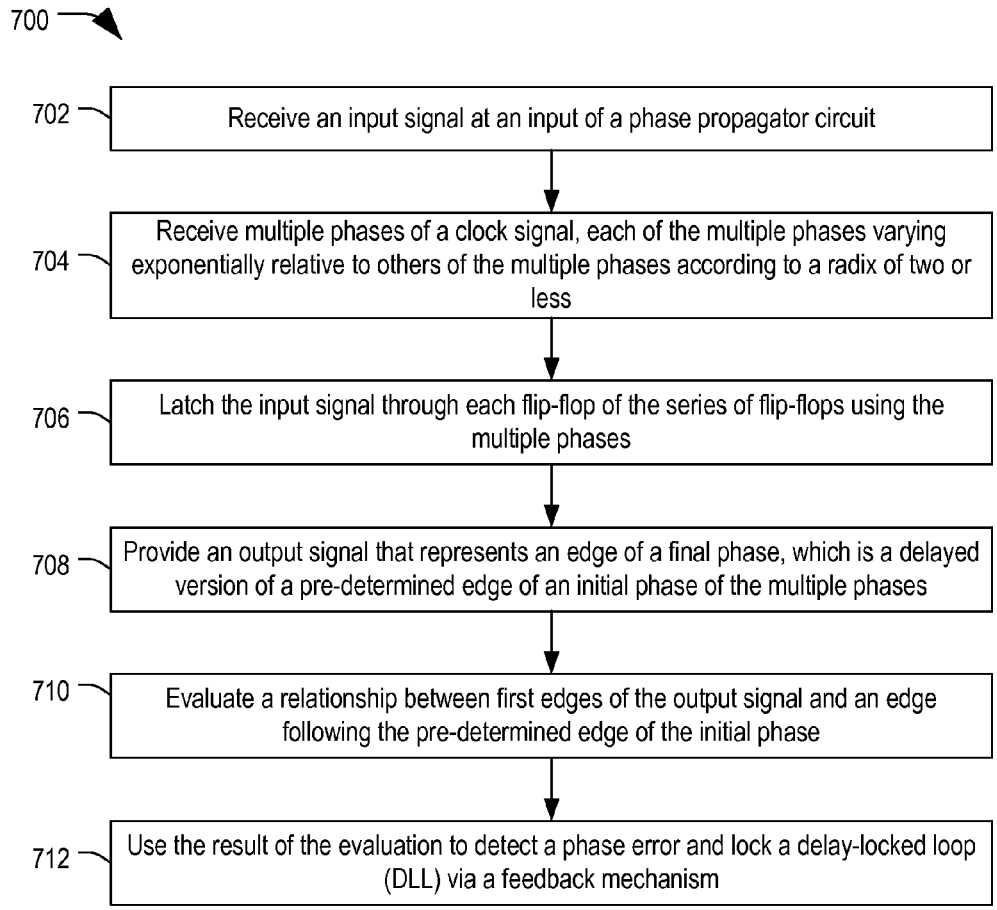
FIG. 7 is a flow diagram of a method of phase locking to a phase of an input signal according to a second embodiment.

FIG. 7 is a flow diagram of a method of phase locking to a phase of an input signal according to an embodiment. At 702, an input signal is received at a delay chain of a phase propagator circuit, where the delay chain includes a series of flip-flops. In an embodiment, the number of flip-flops in the delay chain is determined by a radix of two or less than two. Advancing to 704, multiple phases of a clock signal are received, and each of the multiple phases varies exponentially relative to others of the multiple phases. The clock phases vary exponentially as a function of the selected radix, which has to be less than 2 to avoid false lock condition.

Continuing to 706, the input signal is latched through each flip-flop of the series of flip-flops using the multiple phases. The series of flip-flops operate as a delay chain having a selected delay. Proceeding to 708, an output signal is provided that corresponds to a delayed version of a predetermined edge of an initial phase of the multiple phases.

Moving to 710, the relationship between first edges of the output signal (provided by 708) and an edge following the predetermined edge of the initial phase. This corresponds to evaluating edge $e_0$ of phase ph_$x_N$ and edge $e_1$ of phase ph_x0 in FIG. 5. Proceeding to 712, the result of the evaluation is used to detect a phase error and lock a delay-looked loop (DLL) via a feedback mechanism. In an example, the edge timing of the output signal corresponding to a final phase and the initial phase signal (clock signal) are compared to detect a phase error. In an embodiment, the edge timing is compared by applying the output signal to an input of a flip-flop and applying the clock signal to a clock input of the flip flop. If the input signal is early, the output of the flip-flop indicates a logic high level representing an error of "too fast", and otherwise the output is at a logic low level. This correct phase error information is fed to a DLL feedback mechanism, which ensures correct lock.

In conjunction with the circuits and methods described above with respect to FIGS. 1-7, a DLL circuit is disclosed that includes a phase propagator that includes a reduced number of delay elements compared to conventional systems having the same phase resolution. In an example, the phase propagator utilizes a radix of two or less and uses clock phases scaled according to the same radix to delay an input signal and to phase lock the input signal to a desired phase of the clock signal. As discussed above, the phase scaling may have a variable radix, allowing the scaling factor of the phase indices to vary with a variable radix that is less than two for each subsequent phase index entering phase propagator, resulting in a phase scaling that is essentially-exponential (non-linear) with radix <2.

Although the present invention has been described with reference to preferred embodiments, workers skilled in the art will recognize that changes may be made in form and detail without departing from the scope of the invention.

What is claimed is:

1. A phase detector comprising:
a phase propagator circuit including a plurality of flip-flops, each flip-flop including a clock input, the plurality of flip-flops including a first flip-flop and a second flip-flop, the first flip-flop including an input to receive a signal and including an output, the second flip-flop including an input coupled to the output of the first flip-flop, the phase propagator circuit further includes an n-th flip-flop of the plurality of flip-flops, the n-th flip-flop includes an output configured to provide a phase locked output signal;
a phase controller coupled to the clock input of each flip-flop in the plurality of flip-flops, the phase controller configured to provide a clock signal to the clock input of each of the plurality of flip-flops, the phase controller to apply different phases of the clock signal to the plurality of flip-flops, the different phases including a first phase applied to the clock input of the first flip-flop and a second phase applied to the clock input of the second flip-flop, the first phase is shifted non-linearly relative to the second phase; and
a phase locator configured to receive a first signal at the output of the n-th flip-flop and to receive a second signal from the phase controller, the phase locator configured to determine a difference between the first signal and the second signal.

2. The phase detector of claim 1, wherein the phase controller provides a plurality of clock phases that are shifted exponentially relative to one another with a radix of less than or equal to two.

3. The phase detector circuit of claim 1, wherein a first phase of the plurality of clock phases has a first radix and a second phase of the plurality of clock phases has a second radix.

4. The phase detector of claim 1, wherein the phase propagator circuit includes an input to receive an input signal, a first output to provide the first signal corresponding to a delayed version of the input signal, and a second output to provide the second signal to the clock input of each of the plurality of flip-flops.

5. The phase detector of claim 4, wherein the input signal comprises a power supply voltage.

6. The phase detector of claim 1, wherein the phase locator comprises a flip-flop.

7. The phase detector of claim 1, wherein the number of flip-flops in the plurality of flip-flops is less than half of a selected resolution.

8. A phase detector comprising:
a phase propagator circuit including a series of flip-flops, each flip-flop including a data input, a clock input, and an output;
a phase controller configured to provide a clock signal to the clock input of each of the series of flip-flops, the phase controller configured to apply different phases of the clock signal to the clock inputs of the series of flip-flops, the different phases having phase order indices that are shifted non-linearly relative to one another; and
a phase locator configured to receive a first signal from the output of a last flip-flop of the series of flip-flops and to receive a second signal from the phase controller, the phase locator configured to determine a difference between the first signal and the second signal.

9. The phase detector of claim 8, wherein the phase order indices of the different phases have a radix that is less than or equal to two.

10. The phase detector of claim 9, wherein the radix is selectively varied with the different phases, such that a first phase of the different phases has a first radix and at least one second phase of the different phases has a second radix.

11. The phase detector of claim 10, wherein the radix is selectively varied with respect to some but not all of the different phases.

12. The phase detector of claim 8, wherein the phase order indices of the different phases are shifted substantially exponentially according to a selected radix.

13. The phase detector of claim 8, wherein:
the first signal comprises a delayed signal corresponding to an input signal; and
the second signal comprises a clock compare signal; and
the phase locator to provide an output signal based on a phase difference between the delayed signal and the clock compare signal.

14. The phase detector of claim 8, further comprising a reset input to receive a reset signal; and
wherein the phase propagator, the phase controller, and the phase locator are responsive to the reset signal to reset internal values prior to receipt of the different phases of the set of phase-shifted clock signals.

15. A method of phase locking to an input signal, the method comprising:
receiving an input signal at a phase propagator;
receiving a plurality of clock signals from a phase controller at the phase propagator, the plurality of clock signals having different phases, the different phases shifted non-linearly relative to one another;
applying the different phases of the plurality of clock signals to clock inputs of each of a plurality of flip-flops of the phase propagator; and
generating an output signal, using a phase locator, based on a difference between an output signal of an n-th flip-flop of the plurality of flip-flops and one of the plurality of clock signals the phase controller.

16. The method of claim 15, wherein phase order indices of the different phases differ according to a radix that is less than or equal to two.

17. The method of claim 15, wherein phase order indices of the different phases differ substantially exponentially according to a radix that is less than or equal to two.

18. The method of claim 15, further comprising:
latching the input signal through each flip-flop of the plurality of flip-flops using the different phases provided to clock inputs of the plurality of flip-flops arranged in a series;
providing an output signal that represents an edge of a final phase that is a delayed version of a pre-determined edge of an initial phase of the multiple phases; and
evaluating a relationship between first edges of the output signal and an edge following the pre-determined edge of the initial phase.

19. The method of claim 18, further comprising using a result of the evaluation to detect a phase error or lock a delay-locked loop (DLL).

\* \* \* \* \*